United States Patent [19]

Kesel

[11] Patent Number: 5,554,941
[45] Date of Patent: Sep. 10, 1996

[54] SELF-TESTING METHOD FOR IRREGULAR CMOS SWITCHING STRUCTURES WITH HIGH DEFECT DETECTION

[75] Inventor: Frank Kesel, Zürich, Switzerland

[73] Assignee: Robert Bosch GmbH, Stuttgart, Germany

[21] Appl. No.: 505,296

[22] PCT Filed: Feb. 3, 1994

[86] PCT No.: PCT/DE94/00103

§ 371 Date: Aug. 16, 1995

§ 102(e) Date: Aug. 16, 1995

[87] PCT Pub. No.: WO94/19745

PCT Pub. Date: Sep. 1, 1994

[30] Foreign Application Priority Data

Feb. 20, 1993 [DE] Germany .................. 43 05 288.6

[51] Int. Cl.⁶ ........................................... G01R 31/26
[52] U.S. Cl. ........................................... 324/765; 371/22.5
[58] Field of Search ..................... 324/158.1, 765; 371/22.5, 22.6

[56] References Cited

U.S. PATENT DOCUMENTS

| | | | |
|---|---|---|---|
| 5,097,206 | 3/1992 | Perner | 371/22.5 |
| 5,294,883 | 3/1994 | Akiki et al. | 324/158.1 |
| 5,392,293 | 2/1995 | Hsue | 371/15.1 |
| 5,459,737 | 10/1995 | Andrews | 371/22.5 |
| 5,483,170 | 1/1996 | Beasley et al. | 324/537 |

*Primary Examiner*—Ernest F. Karlsen
*Assistant Examiner*—Russell M. Kobert
*Attorney, Agent, or Firm*—Kenyon & Kenyon

[57] ABSTRACT

A self-testing method for irregular CMOS switching structures with high defect detection is described which combines self testing with linear feedback shift registers and the principle of sensing the static current consumption and partitioning the circuit to be tested. This combination of the two test principles advantageously results in high detection of parametric faults, such as delay faults, high-resistance bridge faults, and functional faults, such as stuck-at, stuck-open and low-resistance bridge faults, in conjunction with a relatively low additional hardware expense.

5 Claims, 2 Drawing Sheets ately assigned partial current sensor TSS (FIG. 3).

SELF-TESTING METHOD FOR IRREGULAR CMOS SWITCHING STRUCTURES WITH HIGH DEFECT DETECTION

FIELD OF THE INVENTION

The present invention relates to a self-testing method and apparatus for irregular CMOS switching structures.

BACKGROUND INFORMATION

A known self-testing method (Koenemann, B.; Mucha, J.; Zwiehoff, G.; Built-In Logic Block Observation Techniques; IEEE Int'l Test Conference, 1979) uses linear feedback shift registers to produce real-time test stimuli and to compress the test responses. In this case, the data flow is observed at internal test points of complex digital circuits. Since the reaction of the circuit to the test stimuli is detected only at the primary outputs of the circuit in this method, bridge faults cannot reliably be identified, specific stuck-at faults can be identified only with difficulty and redundant stuck-at faults cannot be identified at all. In other known self-testing methods (Chang, T.; Wang, C.; Hsu, J.; Two Schemes for Detecting CMOS Analog Faults; IEEE Journal of Solid-State Circuits, Vol. 27, No. 2, Feb. 1992; or Favalli M. et al.; Novel Design for Testability Schemes for CMOS IC's; IEEE Journal of Solid-State Circuits, Vol. 25, No. 5, Oct. 1990), built-in current sensors are used for sensing the static current consumption (Iddq monitoring).

SUMMARY OF THE INVENTION

The present invention provides a method which comprises a combination of self-testing with linear feedback shift registers and the self-testing principle of sensing the static current consumption in conjunction with partitioning the circuit to be tested (combinational logic). Different test modes can be implemented depending on the circuitry (of PH1–PH3). A distinction must be made first of all between a "logic test" and an "Iddq test" (sensing the static current consumption). In the logic test, the reaction of the circuit to the test stimuli of the input register is observed at the primary outputs of the circuit (output register). This test is executed in real time and permits the identification of stuck-at, stuck-open and delay faults and also, in some instances, of bridge faults.

In the Iddq test, the reaction of the circuit is observed by the partial current sensors. In this case, short-circuit faults (stuck-at faults and bridge faults) can be reliably identified up to a maximum magnitude $R_{smax}$, provided that they have been stimulated. Since the observation is carried out by the current sensor in the Iddq test, the fault only has to be stimulated (controllability). As a result of the omission of the observability problem which occurs in the logic test, this leads to an increased fault discovery rate for each test vector or to a reduction in the total number of test vectors required.

Furthermore, the following advantages emerge from using the current sensor:

reliable identifiability of bridge faults which represent a high proportion of the defects in CMOS circuits, a priori identification of high-resistance short-circuit faults before the latter result in logic faults, for example gate oxide shorts, and hence increased reliability of the circuit, identification of redundant stuck-at faults.

Consequently, the combination of the two test principles, the "logic test" and the "Iddq test," exhibits the advantage of high detectability of parametric faults (delay faults, high-resistance bridge faults) and functional faults (stuck-at, stuck-open and low-resistance bridge faults). This advantage can be favorably implemented with an additional hardware expense of about 25%. In this case, there is a resulting trade-off between the additional hardware expense, the resistance $R_{smax}$ of the identifiable short-circuit fault and the test speed for the current sensor.

In an extended refinement of the present invention, in comparison with the known methods and apparatus, precharging of a local node (N1) and evaluation by means of a NOR gate effect for the current sensor an increase in the test speed in conjunction with low circuit complexity. The observed high-resistance nodes (VVDD and N1) are local nodes which can be designed to be short, with the result that interference immunity of the testing method is thereby ensured. The evaluation by the global NOR gate is carried out ratiometrically for these reasons (by means of TPX).

DETAILED DESCRIPTION

Figure 1:
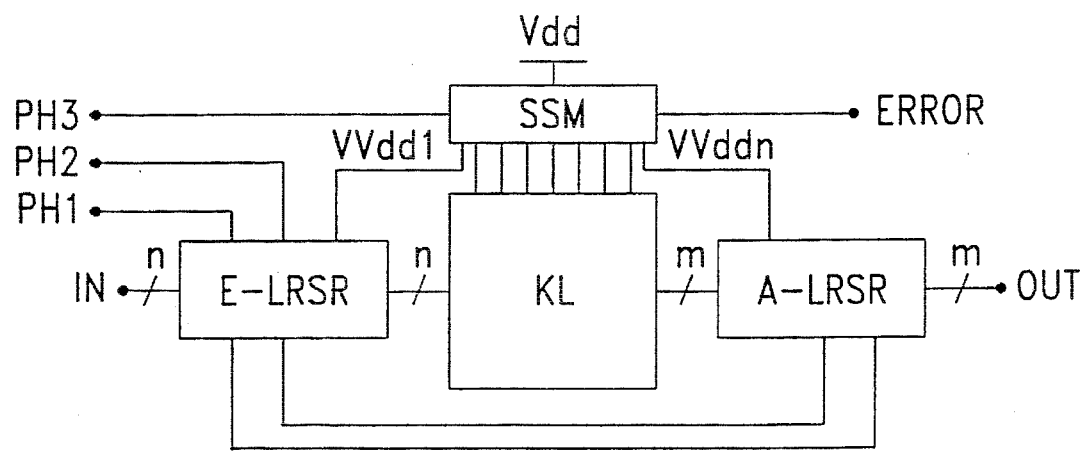
FIG. 1 is a block diagram of a circuit illustrating a self-testing method in accordance with the present invention.

FIG. 1 illustrates the block diagram for the self-testing method, in accordance with the present invention the circuit to be tested comprising an input register E-LRSR, an output register A-LRSR and a combinational logic unit KL. The input register E-LRSR and the output register A-LRSR are multifunctional, linear feedback shift registers.

Figure 3:
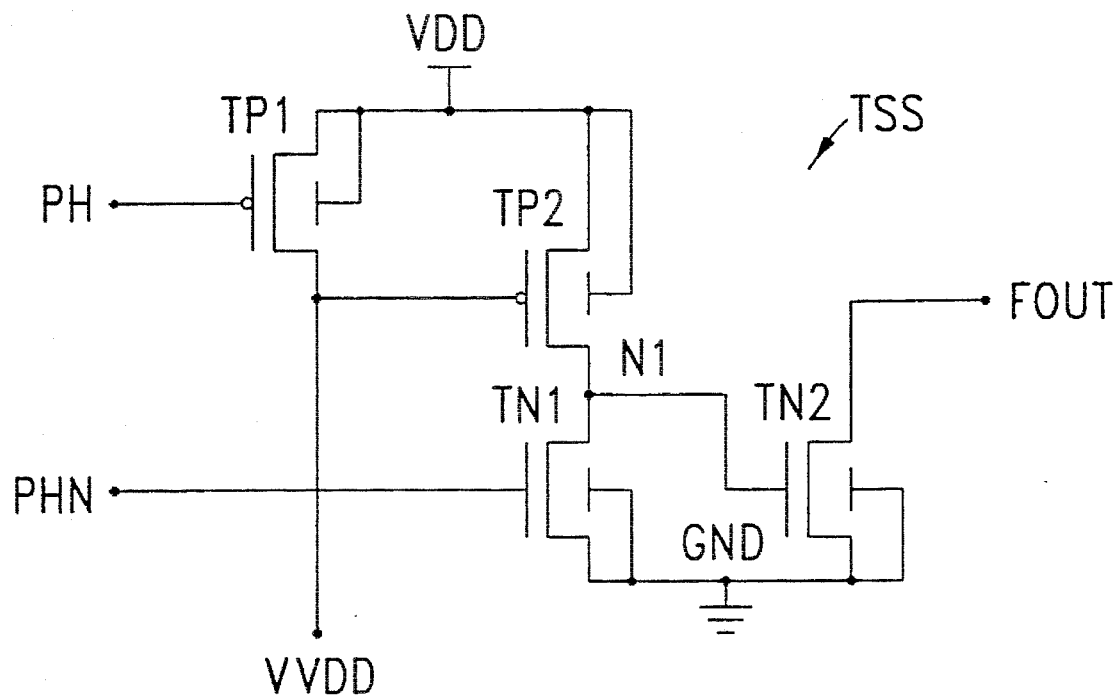
FIG. 3 is a schematic diagram of a partial current sensor of the current sensor module of FIG. 2.

The combinational logic unit KL is designed as static CMOS logic and is partitioned into individual blocks, the power supply lines of the latter being routed separately via a respectively assigned partial current sensor TSS (FIG. 3).

The partial current sensors TSS are combined to form the current sensor module SSM illustrated in FIG. 1.

The partial current sensors TSS or the current sensor module SSM are respectively connected, corresponding to the connections VVdd1 . . . VVddn, to the input register E-LRSR, the partitioned blocks of the combinational logic unit KL and the output register A-LRSR.

Corresponding clock signals are predetermined via the connections PH1, PH2 and PH3, PH1 and PH2 being connected to the input register E-LRSR and PH3 being connected to the current sensor module SSM. A fault signal ERROR is provided at the output of the current sensor module in the case of a detected fault.

Figure 2:
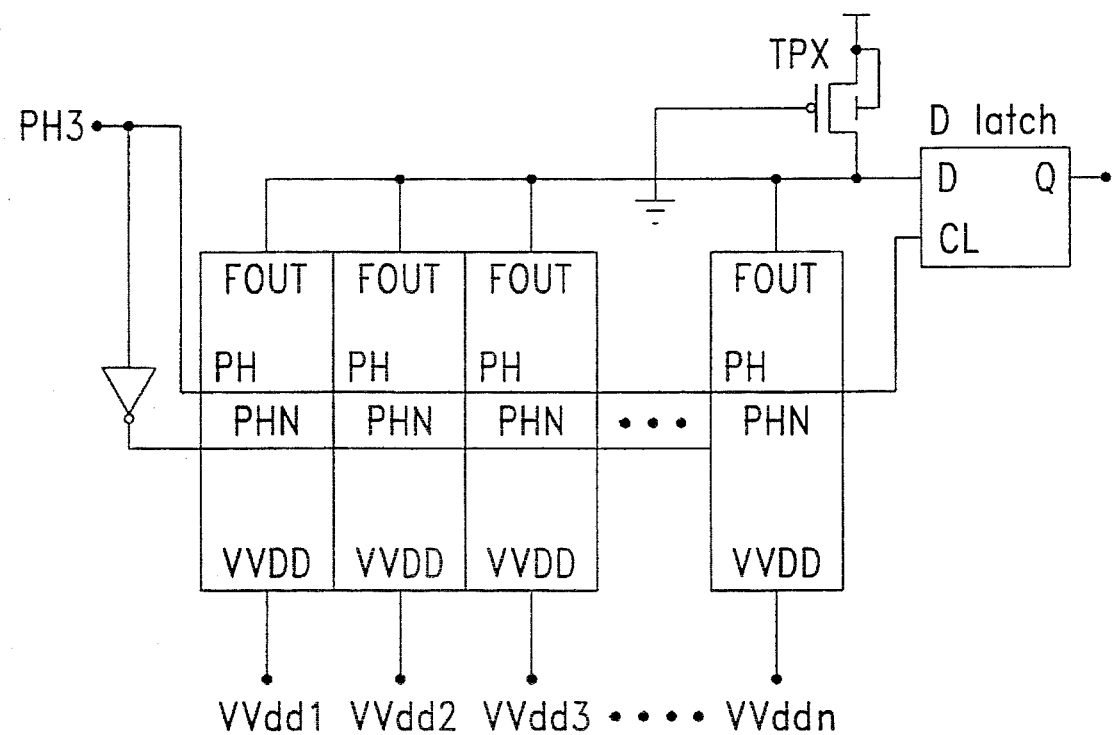
FIG. 2 shows a current sensor module of the circuit of FIG. 1.

The current sensor module SSM is illustrated in more detail in FIG. 2 and comprises partial current sensors TSS whose circuitry is shown in FIG. 3.

The output stages (TN2) of the partial current sensors TSS form a NOR gate with the stage TPX.

In accordance with FIG. 3, the partial current sensors TSS each comprise a first transistor TP1 and sensing transistors, namely a second transistor TP2, a third transistor TN1 and a fourth transistor TN2. The first transistor TP1 is connected both to a clock signal PH and to the power supply line VDD and a node VVDD, the node VVDD being connected to a register E-LRSR or A-LRSR or a block of the combinational logic unit KL (see FIG. 2).

The second transistor TP2 and the third transistor TN1 are connected in series downstream of the first transistor TP1, the second transistor TP2 being likewise connected on the input side to the node VVDD and the third transistor TN1 being connected on the input side to a clock signal PHN.

A local node N1 between the second transistor TP2 and the third transistor TN1 is connected to the input of the fourth transistor TN2, the output of which, together with the switching stage TPX from FIG. 2, forms the NOR gate downstream of which a D latch is connected.

Figure 4:
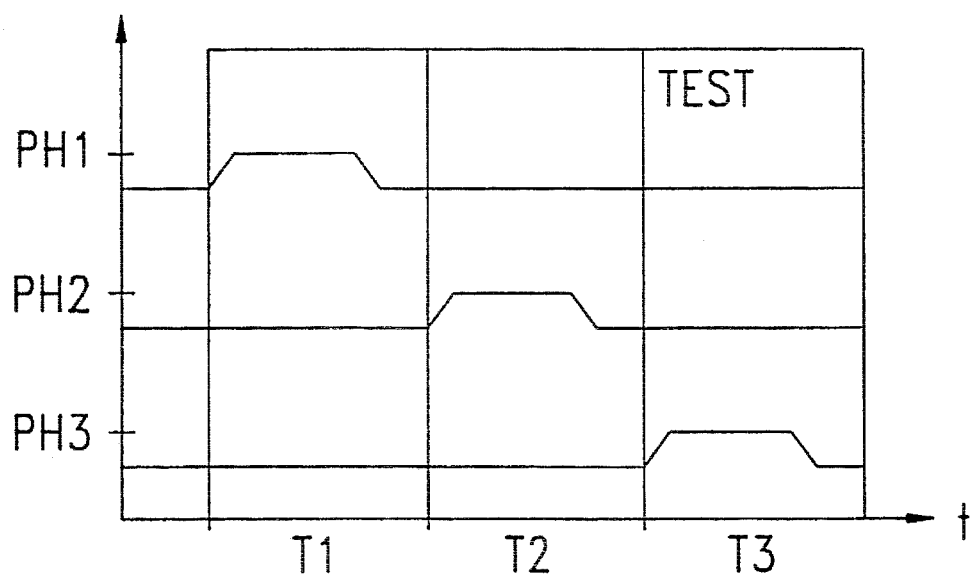
FIG. 4 is a timing diagram of clock signals in the circuit of FIGS. 1–3.

A timing diagram for the generated clock signals PH1, PH2 and PH3 is plotted in FIG. 4, the first two time phases T1 and T2 being intended to represent an operating phase and the third time phase T3 being intended to represent a test phase.

The arrangement shown in FIGS. 1 to 4 functions as follows:

The first transistor TP1 of the partial current sensors according to FIG. 3 is permanently turned on during normal operation of the circuit. In test mode, a test pattern is applied to the combinational logic unit KL by the input register E-LRSR via the clock signals PH1 and PH2. In this case, the first transistor TP1 and the third transistor TN1 are turned on and the second transistor TP2 and fourth transistor TN2 are inhibited. The local node N1 is consequently precharged to 0 volts, corresponding to a clock signal PH3.

After the transient currents in the connected circuit have decayed, corresponding to a delay time of the critical path, the first transistor TP1 and the third transistor TN1 are turned off.

If the circuit is free from faults, the node VVDD continues to have a high resistance and the second transistor TP2 and fourth transistor TN2 do not switch through. However, when there is a fault, the potential across the node VVDD drops below the switching threshold of the second transistor TP2, with the result that the latter switches through and thereby charges the local node N1, whereupon the fourth transistor TN2 switches through and a fault message is carried out via the NOR gate. In the event of a short-circuit fault in one or more blocks of the combinational logic unit KL or the registers E-LRSR or A-LRSR, a logic "0" is fed, in particular, as a fault message into the D latch.

In test mode, the input register E-LRSR generates pseudorandom patterns and the output register A-LRSR compresses the test responses of the combinational logic unit to form a signature, whereas the current sensor module SSM has the task of establishing whether shortcircuit faults (stuck-at faults and bridge faults) are present in the circuit or the registers.

The sensing of the static current consumption is effected by means of a dynamic measurement method which measures the discharge of the capacitances at the node VVDD via the resistance of the short-circuit fault. In this case, the magnitude of the maximum identifiable short-circuit fault resistance $R_{smax}$ is a function of the duration of the test phase T3 (FIG. 4). This results in the trade off between the partitioning of the circuit to be tested into blocks and the dimensioning of the current sensor.

The first transistor TP1 must be dimensioned in such a way that its bulk resistance $R_{on}$ does not cause a predetermined voltage drop $\Delta U_{max}$ to be exceeded for a maximum transient current consumption $I_{trmax}$ of the circuit block.

However, enlarging TP1 causes its parasitic capacitance to increase and hence influences the test time T3 for a predetermined $R_{smax}$ or $R_{smax}$ for a predetermined T3. Therefore, $I_{trmax}$ is determined for the smallest block size of the circuit and the minimum value for TP1 is determined in accordance with the selection of $\Delta U_{max}$. This then results in the trade-off between the parameters block size/hardware expense/test speed/$R_{smax}$. The second transistor TP2 is selected to be small, in order to keep the capacitive load on the node VVDD as small as possible for the above reasons. The third transistor TN1 can be designed to be just as minimal. The fourth transistor TN2 is designed together with TPX in such a way that the NOR gate switches through as rapidly as possible.

The illustrated arrangement can be used to implement various test modes, depending on the circuitry of PH1–PH3, the reaction of the circuit to the test stimuli of the input register E-LRSR being observed in the output register A-LRSR in. the "logic test" and the reaction being observed by the current sensor in the "Iddq test."

If a fault simulation with regard to the fault models mentioned is carried out, for example, in the case of a nine-bit adder, the Iddq test results in a fault detection of 100% for stuck-at and bridge faults after about 10 test vectors, which are produced by means of the register. This means a test time of 500 ns at a clock frequency of 20 MHz. After 100 test vectors, the logic test resulted in a fault detection of about 95% for stuck-open faults and delay faults, corresponding to a test time of 5 μs.

The current sensor can also be used for online observation ("concurrent check") by introducing an additional clock phase T3. The additional clock phase must be introduced since a reliable logic function cannot be ensured in the Iddq test on account of the functional principle of the current sensor (floating VDD). As a result, the following test modes can be implemented (see FIG. 4, too):

Ia) Offline BIST (built-in self-test): if an additional clock phase PH3 is dispensed with, then PH2 is used for the current sensing. Therefore, the logic test and the Iddq test have to be carried out in two test runs. In this case, under certain circumstances the Iddq test must be carried out at a reduced clock frequency, since the circuit to be tested has to have reached its steady state (critical path) before the static current consumption can be sensed.

Ib) Offline BIST: if the additional clock phase PH3 is introduced, then the logic test and the Iddq test can be carried out simultaneously. The logic test then takes place in accordance with FIG. 4 in the phases T1 and T2, corresponding to the clock phases PH1 and PH2; the Iddq test is carried out in T3.

II) Online test (concurrent check): for this purpose, the additional clock phase PH3 is required in every case. The logic function of the circuit is produced in T1 and T2 (clock phase PH1 and PH2); it is tested in T3 whether a short-circuit fault is present in the circuit.

The current sensor can also be designed as a GND sensor in a manner complementary to FIG. 3. Furthermore, it can also be used in single-phase or multi-phase clock systems.

What is claimed is:

1. A system for self-testing a CMOS circuit, comprising:
   a first transistor coupled between a first operating voltage connection and the CMOS circuit, a first node being arranged between the first transistor and the CMOS circuit, the first transistor being turned on in a static state of the CMOS circuit;

a second transistor with a gate coupled to the first node and having a switching point selected so that the second transistor switches with a predetermined potential at the first node, the second transistor being coupled between the first operating voltage connection and a second node; and a third transistor coupled between the second node and a second operating voltage connection, wherein the second and third transistors are off during normal operation of the CMOS circuit, and the second transistor is on when there is a fault in the CMOS circuit, whereby the second node is substantially isolated from the first and second operating voltage connections during normal operation of the CMOS circuit and is coupled with a low impedance to the first operating voltage connection when there is a fault in the CMOS circuit.

2. The system of claim 1, further comprising a fourth transistor with a gate connected to the second node.

3. A system for self-testing a combinational logic unit including a plurality of CMOS circuits, comprising:

a plurality of devices for self-testing a CMOS circuit, each of the devices including:
- a first transistor coupled between a first operating voltage connection and the CMOS circuit, a first node being arranged between the first transistor and the CMOS circuit, the first transistor being turned on in a static state of the CMOS circuit;
- a second transistor with a gate coupled to the first node and having a switching point selected so that the second transistor switches with a predetermined potential at the first node, the second transistor being coupled between the first operating voltage connection and a second node;
- a third transistor coupled between the second node and a second operating voltage connection; and
- a fourth transistor with a gate connected to the second node, wherein the second and third transistors are off during normal operation of the CMOS circuit, and the second and fourth transistors are on when there is a fault in the CMOS circuit; and a further transistor coupled to an output of the fourth transistor of each of the plurality of devices, wherein the further transistor in conjunction with the fourth transistors of the plurality of devices forms a gate which generates a signal when one of the fourth transistors is on.

4. The system of claim 3, wherein the combinational logic unit for the self-testing is driven by a pseudorandom sequence generated by a linear feedback register.

5. The system of claim 3, wherein the combinational logic unit is tested by a linear feedback input shift register and a linear feedback output shift register with regard to its logic function in that a pseudorandom sequence is applied to the combinational logic unit by the linear feedback input register and in that the reactions of the combinational logic unit are compressed by the linear feedback output register to form a signature and in that the signature is compared with a desired signature.

* * * * *